United States Patent
Russell et al.

(10) Patent No.: US 9,141,552 B2
(45) Date of Patent: **\*Sep. 22, 2015**

(54) MEMORY USING VOLTAGE TO IMPROVE RELIABILITY FOR CERTAIN DATA TYPES

(71) Applicants: Andrew C. Russell, Austin, TX (US); Ravindraraj Ramaraju, Round Rock, TX (US)

(72) Inventors: Andrew C. Russell, Austin, TX (US); Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 212 days.

This patent is subject to a terminal disclaimer.

(21) Appl. No.: 13/736,322

(22) Filed: Jan. 8, 2013

(65) Prior Publication Data

US 2014/0195733 A1 Jul. 10, 2014

(51) Int. Cl.
*G06F 12/00* (2006.01)
*G06F 12/08* (2006.01)
*G11C 11/412* (2006.01)

(52) U.S. Cl.
CPC ........ *G06F 12/0864* (2013.01); *G06F 12/0893* (2013.01); *G11C 11/4125* (2013.01); *G06F 2212/1032* (2013.01)

(58) Field of Classification Search
CPC ... G06F 12/00; G06F 11/073; G06F 11/1064; G06F 12/0846; G06F 11/002; G06F 11/106; G06F 11/004; G06F 1/3203; G06F 12/0864; G06F 2212/1032; G06F 12/0893; G11C 11/4125
See application file for complete search history.

(56) References Cited

U.S. PATENT DOCUMENTS

| | | | |
|---|---|---|---|
| 5,303,190 A | 4/1994 | Pelley, III | |
| 6,766,431 B1 | 7/2004 | Moyer | |
| 6,772,383 B1* | 8/2004 | Quach et al. | 714/746 |
| 7,100,004 B2 | 8/2006 | Johnson et al. | |
| 7,434,012 B1 | 10/2008 | Ives et al. | |
| 7,437,597 B1 | 10/2008 | Kruckemyer et al. | |
| 7,564,093 B2* | 7/2009 | Matsuda | 257/315 |
| 7,606,980 B2 | 10/2009 | Qureshi et al. | |
| 7,716,428 B2* | 5/2010 | Guthrie et al. | 711/141 |
| 7,882,323 B2 | 2/2011 | Allison et al. | |
| 8,024,638 B2 | 9/2011 | Resnick et al. | |
| 2003/0191888 A1* | 10/2003 | Klein | 711/105 |
| 2004/0243886 A1 | 12/2004 | Klein | |
| 2007/0011513 A1 | 1/2007 | Biswas et al. | |
| 2009/0144503 A1* | 6/2009 | Faucher et al. | 711/128 |
| 2010/0176841 A1* | 7/2010 | Jang et al. | 326/13 |
| 2010/0191990 A1* | 7/2010 | Zhang et al. | 713/320 |

OTHER PUBLICATIONS

Tezzaron Semiconductor, Soft Errors in Electronic Memory—A White Paper, Version 1.1, Jan. 5, 2004.*
S. Jahinuzzaman et al., A Soft Error Tolerant 10T SRAM Bit-Cell With Differential Read Capability, IEEE Transactions on Nuclear Science, vol. 56, No. 6, Dec. 2009.*

(Continued)

*Primary Examiner* — Cheng-Yuan Tseng
*Assistant Examiner* — Francisco Grullon
(74) *Attorney, Agent, or Firm* — Terrile, Cannatti, Chambers & Holland, LLP; Stephen A. Terrile

(57) ABSTRACT

A method for minimizing soft error rates within caches by configuring a cache with a certain way which is more resistant to soft errors and then using this way to store modified data. In certain embodiments, the memory is made more soft error resistant by increasing a voltage across bitcells of the cache.

17 Claims, 7 Drawing Sheets

(56) References Cited

OTHER PUBLICATIONS

K. Flautner et al., Drowsy Caches: Simple Techniques for Reducing Leakage Power, 29th Annual International Symposium on Computer Architecture, 2002.*

J. Barth et al., A 45nm SOI Embedded DRAM Macro for POWER7(TM) 530319032MB On-Chip L3 Cache, IEEE International Solid-State Circuits Conference, Session 19, High-Performance Embedded Memory 19.1, 2010.

IBM Techdocs FAQ: Power 6 Frequently Asked Question, What is Hardware Assisted Memory Scrubbing and how is it used?, printed Jul. 13, 2012.

Wikipedia.org, Error detection and correction, Error-correcting code, printed Jul. 13, 2012.

Wikipedia.org, Memory scrubbing, printed Jul. 13, 2012.

S. Jahinuzzaman et al., IEEE Transactions on Nuclear Science, vol. 56, No. 6, Dec. 2009.

R. Naseer et al., The DF-Dice Storage Element for Immunity to Soft Errors, 48th Midwest Symposium on Circuits and Systems, Aug. 7-10, 2005 pp. 303-306.

F. Ootsuka et al., A Novel 0.25 Full CMOS SRAM Cell Using Stacked Cross Couple With Enhanced Soft Error Immunity, Proc. Int. Electron Devices Meeting, 1998, pp. 205-208.

\* cited by examiner

MEMORY USING VOLTAGE TO IMPROVE RELIABILITY FOR CERTAIN DATA TYPES

CROSS-REFERENCE TO RELATED APPLICATION

U.S. patent application Ser. No. 13/736,310, filed on Jan. 8, 2013, entitled "Memory with Improved Reliability for Certain Data Types" by inventors Andrew Russell and Ravindraraj Ramaraju, describes exemplary methods and systems and is incorporated by reference in its entirety.

U.S. patent application Ser. No. 13/588,194, filed on Aug. 17, 2012, entitled "Memory Scrubbing Rate Based on Data Type" by inventors Ravindraraj Ramaraju, William C. Moyer, and Andrew C. Russell, describes exemplary methods and systems and is incorporated by reference in its entirety.

U.S. patent application Ser. No. 13/588,243, filed on Aug. 17, 2012, entitled "Data Type Dependent Memory Scrubbing" by inventors Ravindraraj Ramaraju, William C. Moyer, and Andrew C. Russell, describes exemplary methods and systems and is incorporated by reference in its entirety.

BACKGROUND OF THE INVENTION

1. Field of the Invention

The present invention relates in general to the field of improving the error resilience of memories.

2. Description of the Related Art

In general, data processing systems comprise a processor (often referred to as a central processing unit (CPU)) that executes instructions that are fetched from a main memory. One method to improve the performance of the processor is to use cache memory. Cache memory is high speed memory that works with the processor and the main memory to quickly provide information (e.g., instructions and/or data) to the processor. By using a cache architecture, a faster response time is possible than when the processor fetches all information directly from the main memory. The improved performance is possible because the cache usually contains the information that the processor is likely to request from memory. The cache is typically faster than the main memory; therefore, the cache can usually provide the data required by the processor much faster than the main memory. Part of the methodology used to load information into the cache is to predict and store the information that is frequently used by the processor and is likely to be used by the processor.

When the cache contains information requested by the processor, this is referred to as a cache hit. If the cache does not contain the information requested by the processor, then this is referred to as a cache miss. On a miss, the information is loaded from the main memory into the cache and is also provided to the processor. The information is loaded into the cache in anticipation that the processor will request the data in an upcoming bus cycle. This process continues throughout the operation of the data processing system.

Caches typically include a cache tag array and a cache data array. Each array is organized into a number of cache lines. Each cache line includes a tag portion (contained in the cache tag array) and a data portion (contained in the cache data array). The tag value in a line is compared with the address of a memory request from the processor to determine whether the requested data is present in the data portion of that cache line. Validity information is associated with each cache line to indicate whether the line contains currently valid information and whether the information conforms to the information stored within the main memory (referred to as cache coherency). Additionally, for caches which can operate in a copy-back or writeback mode, additional status information is retained to indicate whether the cache line is modified (dirty) relative to the value stored in main memory. One example of a protocol for cache coherency is the modified, exclusive, shared, invalid (MESI) protocol.

One issue relating to caches is that with the scaling of technology and power supply, the bitcells are often more sensitive to soft errors. Another issue relating to caches is that to reduce the standby leakage power, the cache memories are often retained in a low power state during an inactive state. This low power state is known to contribute towards increasing the soft error rate (SER). Another issue relating to caches is that because modified data is not stored anywhere else within the data processing system, it is particularly desirable to protect this modified data against loss such as loss due to soft errors within the cache because the loss would be unrecoverable.

BRIEF DESCRIPTION OF THE DRAWINGS

The present invention is illustrated by way of example and not limitation in the accompanying figures, in which like references indicate similar elements, and in which.

DETAILED DESCRIPTION

In general embodiments of the present invention, a method and apparatus for minimizing soft error rates of modified data within memories such as caches by storing modified data in a more soft error resistant memory location compared to unmodified data is disclosed. More specifically, in certain embodiments, the memory is made more soft error resistant by increasing a voltage across the bitcells of the memory.

In certain embodiments, the method and apparatus involves partitioning the memory into more soft error resistant and less soft error resistant memory locations. More specifically, in certain embodiments, the memory locations are partitioned by way and at least one of the ways is configured to be more soft error resistant. Additionally, in certain embodiments, the memory includes a set-associative, multi-way cache. With a set-associative, multi-way cache, a particular address maps to a set in the cache and a cache controller selects which of the ways in the set to write the data value. If modified data is to be written to the cache, the cache controller causes the data to be written to the way with improved soft error resistance and if unmodified data is to be written, the cache controller causes the data to be stored in one of the other less soft error resistant ways.

In certain embodiments, partitioning the data into more soft error resistant memory locations and less soft error resistant memory locations provides a system in which additional leakage power expended in improving soft error resistance by increasing the voltage across the bitcell is limited to only modified data. Unmodified data has a reduced voltage across the bitcell to save power. In certain embodiments, the voltage across the bitcell is increased by turning off a drowsy mode of operation or by boosting the voltage to the bitcell. Additionally, in certain embodiments, the improved soft error resistance is variable because the bitcell voltage in any of the ways can be adjusted. Furthermore, the number of memory locations more resistant to soft errors is variable as more or less memory locations can be made more or less resistant to soft errors by adjusting the voltage across the bitcells.

Figure 1:
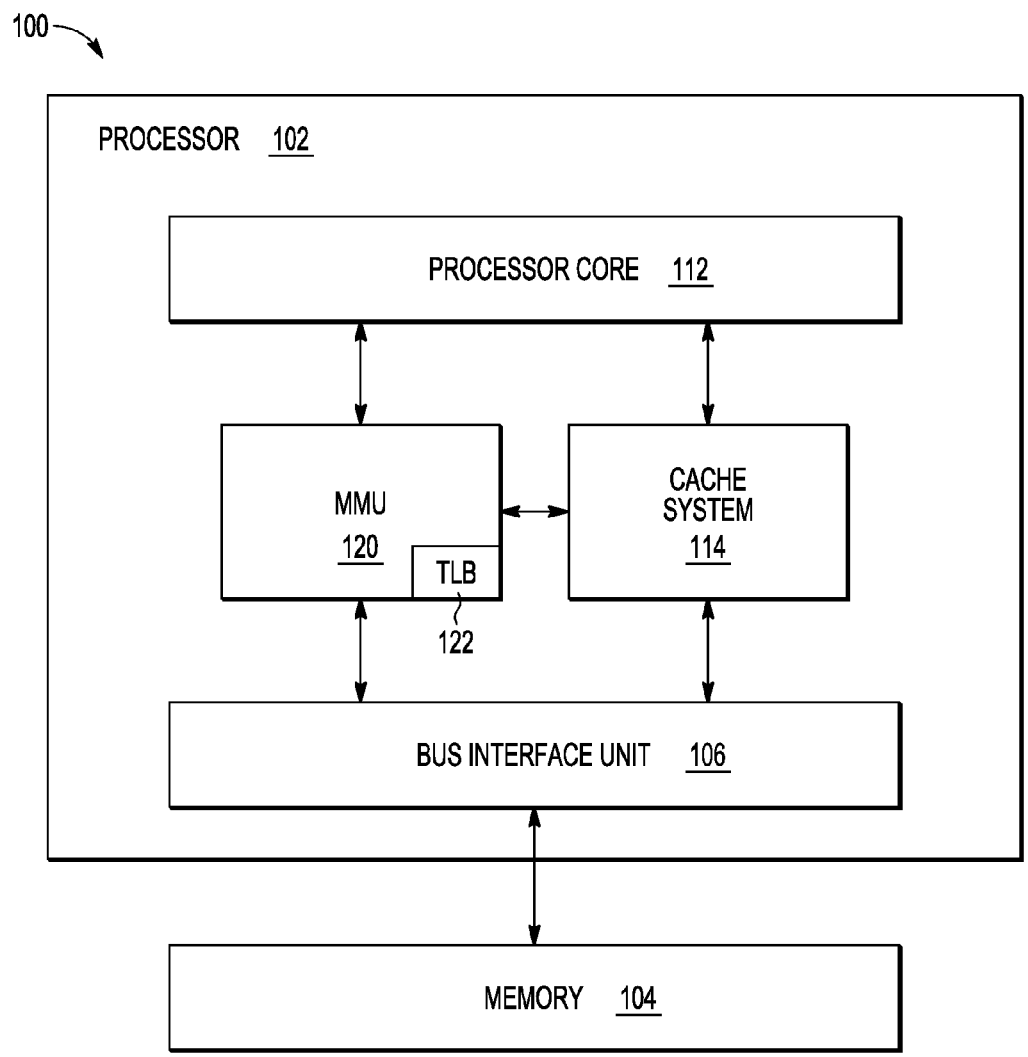
FIG. 1 shows a block diagram of a data processing system.

Referring to FIG. 1, a block diagram of a data processing system 100 is shown. The data processing system includes a processor 102 as well as a memory 104 and a bus interface unit 106. The processor 102 includes at least one processor core 112 as well as a cache system 114. It will be appreciated that while the data processing system 100 shows a single unified cache, separate instruction and data caches are contemplated. The processor 102 is coupled to the memory 104 via the bus interface unit 106. The memory 104 and the cache system 114 are managed by a memory management unit (MMU) 120. The MMU 120 includes a translation lookaside buffer (TLB) 122. The memory 104 includes one or more memory devices. The components of the data processing system 100 are coupled together by various buses used to pass control, address, and data signals.

Figure 2:
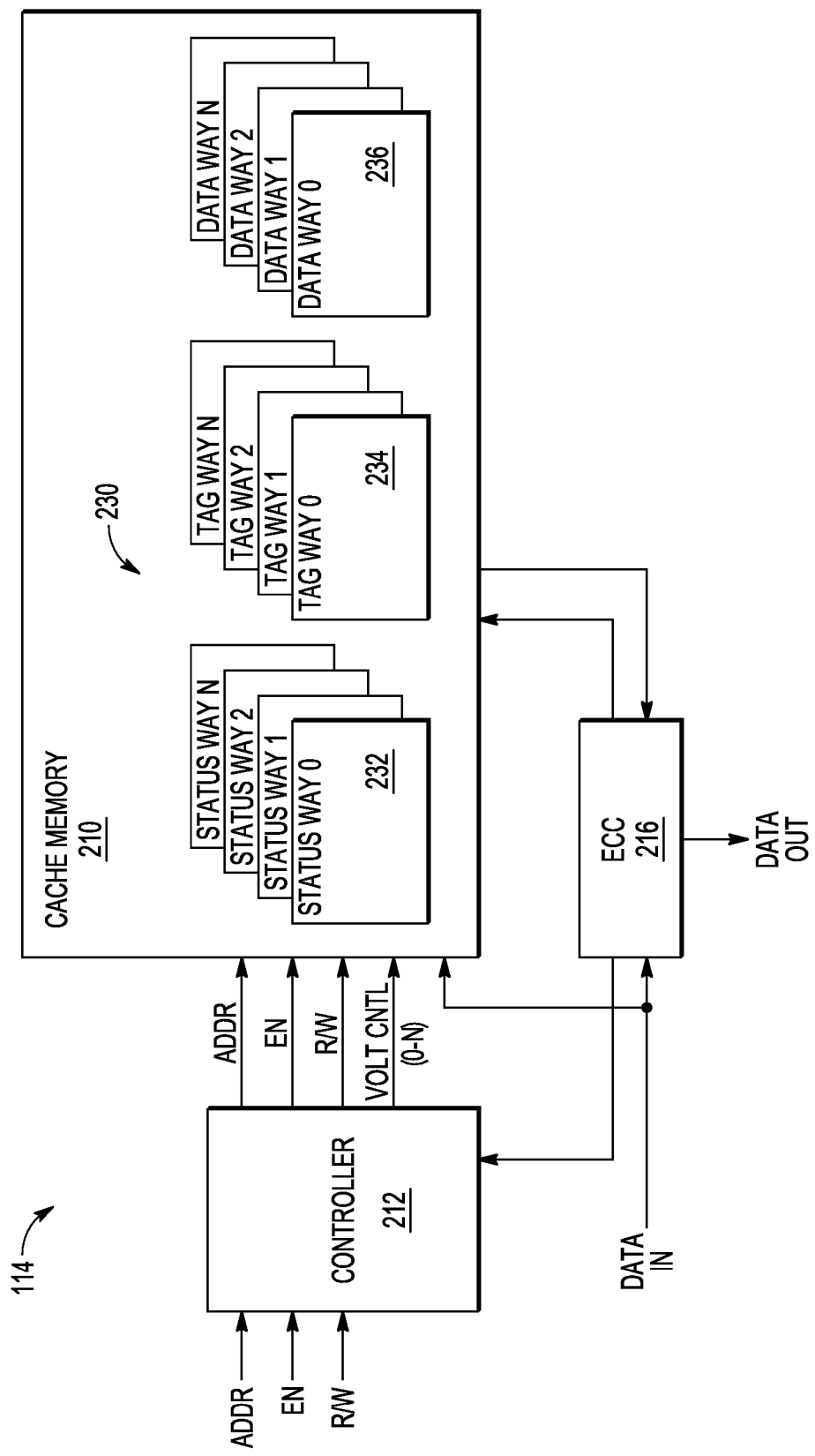
FIG. 2 shows a block diagram of a cache system.

Referring to FIG. 2, a block diagram of a cache system 114 is shown. The cache system 114 includes a cache memory 210 as well as a controller 212 and error correction code (ECC) logic 216.

The controller 212 receives an address signal (ADDR), an enable signal (EN) and a read/write signal (R/W) and provides the address signal, the enable signal and the read/write signal as well as N+1 voltage control signals (VOLT CNTL [0:N]) to the cache memory 210. In certain embodiments, the controller 212 receives voltage control signals and passes these signals to the cache memory 210, and in other embodiments, the controller 212 generates the voltage control signals based upon input from the data processing system 100. In certain embodiments, the controller 212 operates in accordance with a cache coherency protocol such as the MESI cache coherency protocol.

The ECC logic 216 provides and receives information from the cache memory 210. The ECC logic 216 also provides error information to the controller 212. More specifically, the ECC logic 216 receives a data input (e.g., an n-bit wide data input) from the data processing system 100 and generates a correction code based upon the data input (e.g., a k-bit wide correction code). The data input and the corresponding correction code are both provided to and stored within the cache memory 210 (e.g., an n+k bit wide input). The ECC logic 216 also receives data and correction code information from the cache memory 210 (e.g., an n+k bit wide data output) and generates a data output (e.g., an n-bit wide data output) after confirming that the data is correct based upon the correction code information. In certain embodiments, the ECC logic 216 uses a hamming code to provide single error correction and double error detection (SEC-DED).

The cache memory 210 includes a plurality of cache ways (also referred to as banks) 230 (WAY 0, WAY 1, WAY 2, WAY N). Each way 230 includes a plurality of cache lines. In certain embodiments, the cache ways 230 further include a plurality of status ways 232, a plurality of tag ways 234, and a plurality of data ways 236. The combination of the information from a line of the status ways 232, a line of the tag ways 234, and the data ways 236, provides a cache line. It will be appreciated that these ways may be separate or combined as a matter of design choice. In certain embodiments, the status ways store information used by the controller 212 to perform the MESI cache coherency protocol.

In general, when the processor core 112 makes a memory access request, the MMU 120 translates the virtual address of the request, via the TLB 122, and determines the corresponding physical address for the access. Note that some address requests contain the physical address directly, and do not require translation. The cache system 114 then determines whether the information requested by the processor core 112 is present in cache memory 210 by comparing address information in the request to tag information in the tag array 234. If the requested information is determined to be present in cache memory 210, the information read from the data array 236 is provided to the processor core 112. If the requested information is not present in the cache memory 210, the data processing system 100 accesses the memory 104 using the physical address determined via the TLB 122. The requested information is stored within the cache system 114 and is also provided to the processor core 112.

Figure 3:
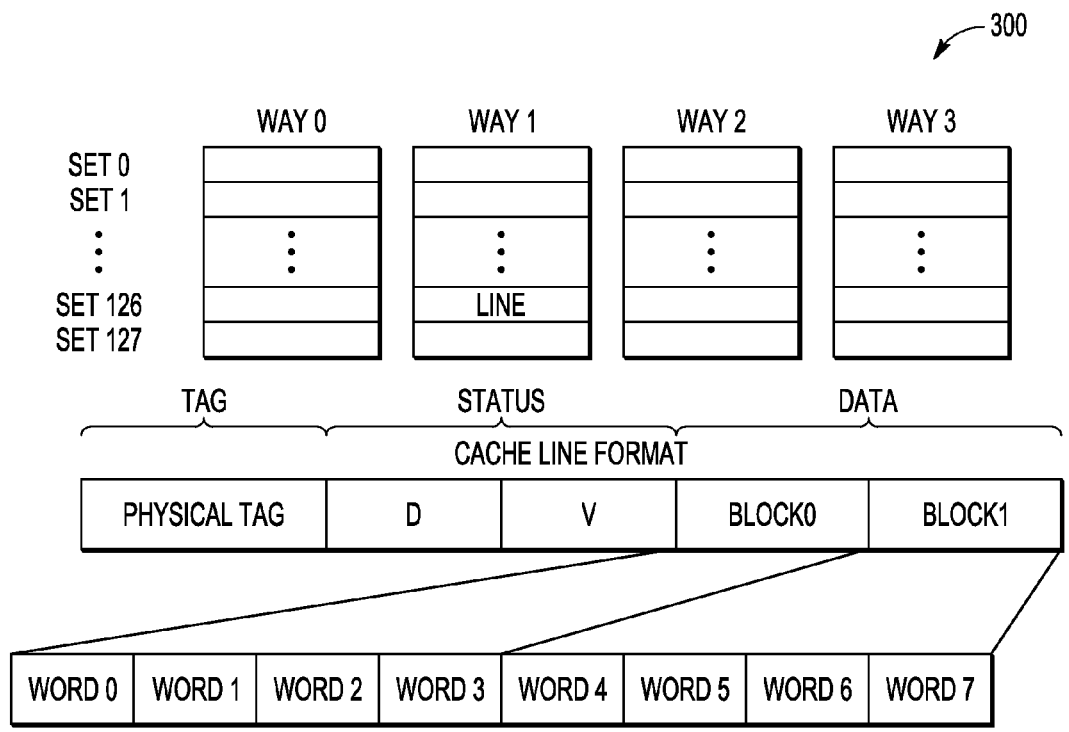
FIG. 3 shows a block diagram of the organization of a 4-way associative cache.

Referring to FIG. 3, a block diagram showing the organization of a 4-way associative cache 300 used in one embodiment of the present invention is shown. Note that the invention is not limited to this organization or to associative caches. FIG. 3 shows a cache having 4 ways (WAY 0, WAY 1, WAY 2, and WAY 3), each having 128 sets (SET 0, SET 1, . . . SET 126, and SET 127). For each set, there are 4 cache lines, one corresponding to each way. Each cache line includes a plurality of blocks and each block includes at least one word location. Each line includes two blocks (BLOCK0, BLOCK1), each containing four words. Any data stored in the cache system 114 is contained in one of the blocks. The ways are configured so that at least one of the ways is more resistant to soft errors than the other ways.

Each line also includes an address tag (TAG) which corresponds to the address of the data contained in the blocks. Each line also includes a valid bit V which signifies whether or not the cache blocks BLOCK0 and BLOCK1, contain valid information. Each line also includes a dirty bit D which is set to "1" when the data contained in the line has been modified by the processor (i.e., the line contains modified data) and is therefore not consistent with the information in the corresponding physical memory location. If the data in a line is "dirty," the modified data is eventually written to the physical memory location. This process is referred to as "copy-back."

The controller 212 of the cache system 114 controls the placement and storage of information within the cache such that modified information is stored within a single way (e.g., WAY 0), or a subset of ways (e.g., WAYS 0 and 1) that are more soft error resistant. The cache controller 212 controls this placement based upon the state of the dirty bit of the cache line. In this manner, the controller 212 can dynamically choose the ways 230 of the cache system 114 so that the way or subset of ways in which modified data are stored are more resistant to errors. Additionally, if data is read from one way and then modified, the modified data is stored to the more soft error resistant way. In this case, the location from which the data was read is invalidated so that it may be used again for unmodified data.

The controller 212 maintains a predetermined sequence and process of storing all modified information of the data processing system 100 in a subset of ways 230 of the cache system 114. The controller 212 controls the subset of the ways of the tag and/or data arrays of the cache with the modified information to be more error resistant compared to the rest of the ways of the tag and/or data arrays with clean information (i.e., information where the information stored within the main memory is coherent with the information stored within the cache). Because there is an additional location of the clean information (e.g., the clean information is also stored within memory 104), if a single event upset (SEU) error event occurs in a way containing clean information, the error can be detected and correct data can be reloaded from the memory 104. Ways containing potentially modified data are stored within more error resistant locations to minimize the chances of multiple SEUs causing an uncorrectable error which cannot be recovered.

Figure 4:
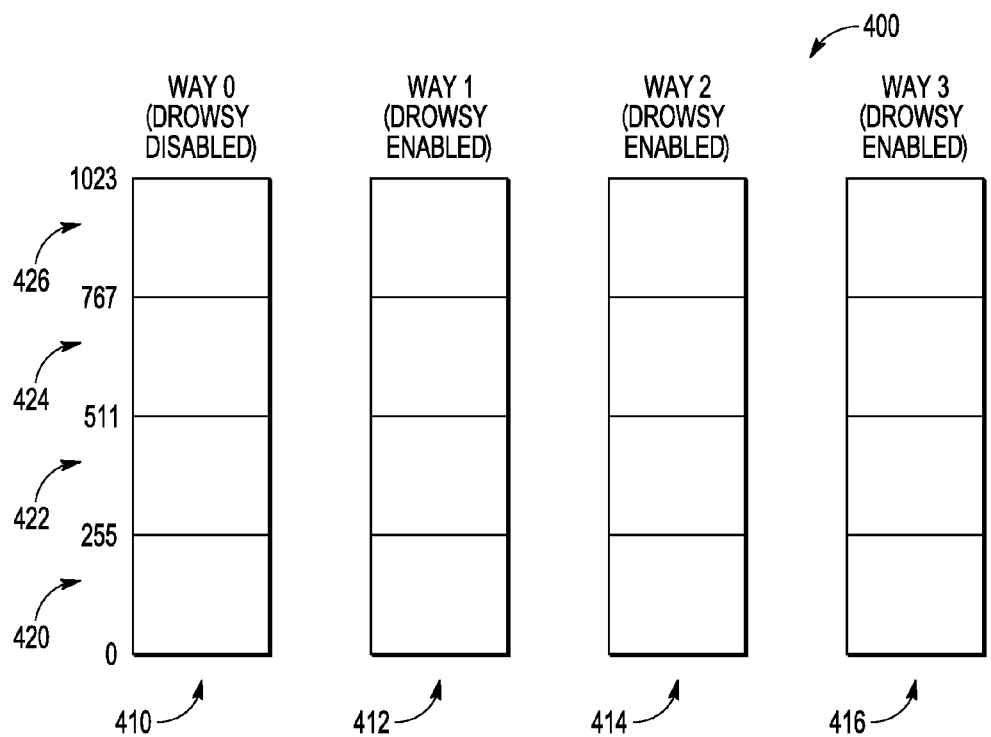
FIG. 4 shows a block diagram of an exemplative cache architecture.

Referring to FIG. 4, a block diagram of an exemplative cache architecture is shown. More specifically, in certain embodiments, a cache array 400 (such as status array 232, tag array 234 and data array 236) is partitioned into ways (410, 412, 414, 416). Each way is further divided into way unit blocks (WUBs). Each way unit block includes a bit array or plurality of bit arrays. For example, in one embodiment, a way stores 1024 lines of information, each way unit block includes 256 lines of storage, and each line includes a plurality of bits. Thus, in this embodiment, a way includes four way unit blocks (420, 422, 424, 426).

In this cache architecture, certain ways are operated in a drowsy disabled mode of operation corresponding to a more error resistant mode of operation and certain ways are operated in a drowsy enabled mode of operation corresponding to a less error resistant mode of operation. Bitcells are less likely to flip state as the result of an alpha particle or neutron strike in the more error resistant mode of operation compared to the less error resistant mode. For example in certain embodiments, Way 0 bitcells have drowsy mode disabled whereas Way1-Way3 bitcells have the drowsy mode enabled. The amount of memory that is more resistant to soft errors is adjustable since drowsy mode can be disabled for additional ways to allow for the storage of more modified data. When Way 0 is the only way in which the drowsy mode of operation is disabled, modified data is only stored in Way 0 because this way is more resistant to soft errors. If Way 0 is full, then the drowsy mode of operation can be disabled in Way 1 to allow modified data to also be stored in Way 1, thus increasing the number of memory locations available for modified data storage. Furthermore, since each way can be divided into way unit blocks, drowsy mode can be enabled and disabled for portions of a way. For example, drowsy mode can be enabled for way unit blocks that do not contain modified data whereas drowsy mode is disabled for way unit blocks containing modified data.

Figure 5:
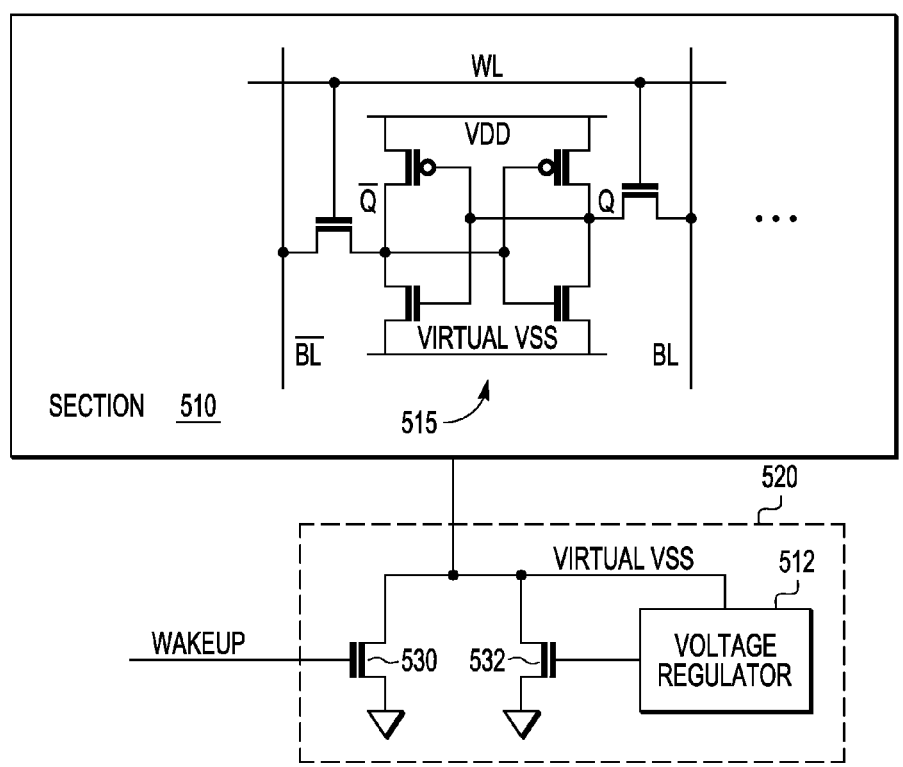
FIG. 5 shows a block diagram of a bit array architecture.

Referring to FIG. 5, a block diagram of a bit array architecture is shown. The bit array architecture includes a section 510 comprising a plurality of bitcells 515 organized into rows and columns as well as a drowsy circuit 520. Various types of cache storage units such as ways, banks, way unit blocks and groups of bitcells may each be considered to be sections within the cache. The drowsy circuit 520 further includes a voltage regulator 512 as well as transistors 530, 532. Not shown in FIG. 5 are certain aspects of a bit array architecture such as wordline drivers, sense amplifiers, write drivers for writing data into the bitcells and other peripheral circuits often required for reading and writing the bitcells.

The drowsy circuit 520 receives a wakeup signal and provides a virtual vss signal to the bit array 510. In certain embodiments, the wakeup signal corresponds to one of the voltage control signals (VOLT CNTL[0:N]) provided by controller 212. When operating in a drowsy mode of operation, the drowsy circuit 520 reduces bitcell leakage of the bit array by reducing the voltage across the bitcells. In a drowsy mode of operation, the wakeup signal is inactive so that transistor 530 is off and the gate voltage of transistor 532 is controlled by voltage regulator 512 so that the virtual vss voltage level is raised above ground (e.g., by 200 mV) by the desired amount when the bit array is not accessed. The drowsy mode of operation decreases soft error resistance because the amount of charge on the bitcell storage node is decreased due to the reduced voltage across the bitcell. Accordingly, when it is desirable to increase soft error resistance, controller 212 disables drowsy mode for the bit array by asserting the wakeup signal so that transistor 530 is turned on shorting the virtual vss node to ground so that the full vdd voltage appears across the bitcell.

While FIG. 5 shows the regulation of bitcell virtual vss, other embodiments may instead control bitcell virtual vdd (not shown) to reduce the voltage across the bitcells by lowering virtual vdd below vdd to reduce bitcell leakage.

Figure 6:
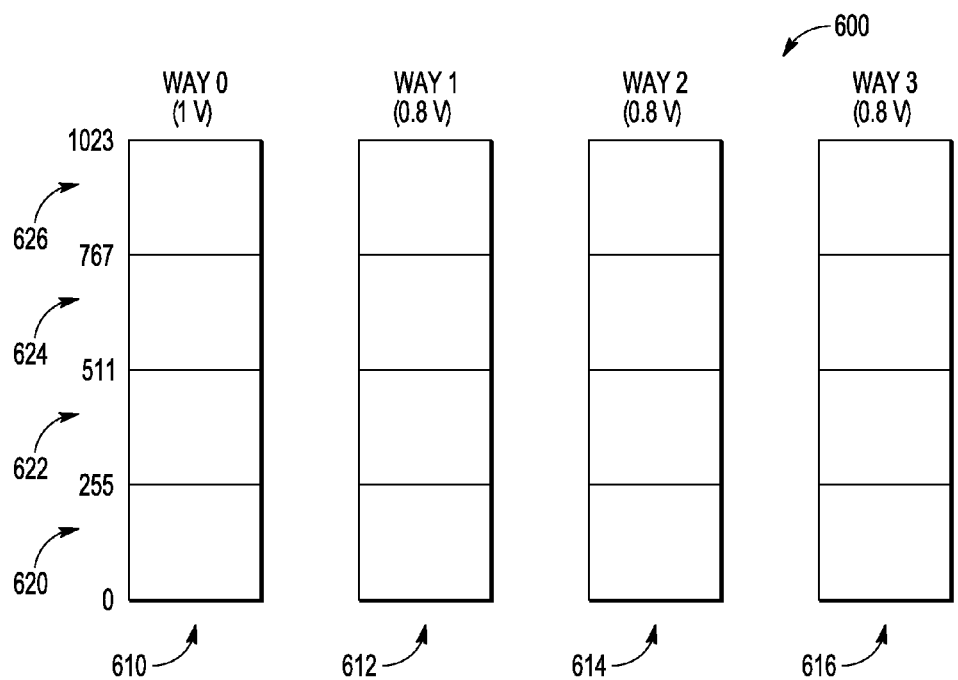
FIG. 6 shows a block diagram of another exemplative cache architecture.

Referring to FIG. 6, a block diagram of another exemplative cache architecture is shown. In certain embodiments, a cache array 600 (such as status array 232, tag array 234 and data array 236) is partitioned into ways (610, 612, 614, 616). Each way is further divided into way unit blocks (WUBs). Each way unit block includes a bit array or a plurality of bit arrays. For example, in one embodiment, a way stores 1024 lines of information, each way unit block includes 256 lines of storage, and each line includes a plurality of bits. In this embodiment, a way includes four way unit blocks (620, 622, 624, 626).

In this cache architecture, memory locations are made more resistant to soft errors by increasing the voltage across the bitcell. More specifically, certain ways are operated at one voltage (i.e., they receive a certain voltage level) and other ways are operated at another voltage (i.e., they receive another voltage level). The voltage at which the ways are operated determines how resistant a particular way is to soft errors. For example, in certain embodiments, Way 0 bitcells receive a 1V supply whereas Way 1-3 bitcells receive a 0.8V supply for reduced leakage. The amount of memory that is more resistant to soft errors is adjustable because the voltage to additional ways can be increased to allow for the storage of more modified data.

In certain embodiments, modified data is only stored in Way 0 since this way is more resistant to soft errors. If Way 0 is full, the voltage to Way 1 can be increased to 1V to allow modified data to be stored in Way 1 thus increasing the number of memory locations available for modified data storage. If Way 0 is full when storing modified data (even if the other ways are not), then a replacement algorithm is used to evict data to make room for new modified data. Unmodified data is stored within any of the ways (Way 0-Way 3).

Figure 7:
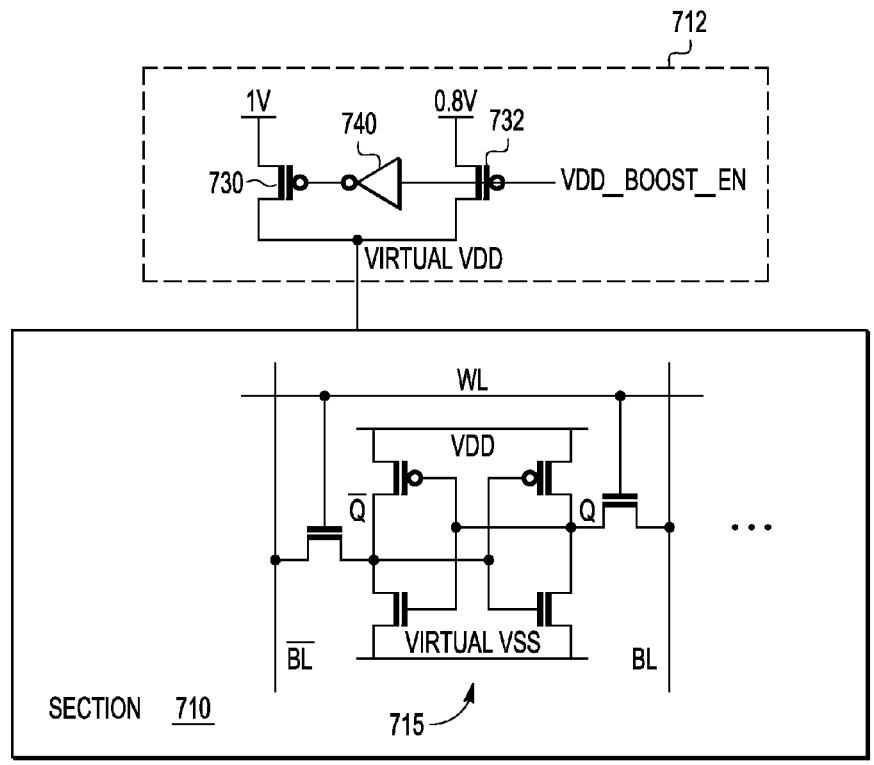
FIG. 7 shows a schematic block diagram of another bit array architecture.

Referring to FIG. 7, a block diagram of a bit array architecture is shown. The bit array architecture includes a section 710 comprising a plurality of bitcells 715 organized into rows and columns as well as a voltage multiplexer (MUX) circuit 712. Various types of cache storage units such as ways, banks, way unit blocks and groups of bitcells may each be considered to be sections within the cache. The voltage multiplexer circuit 712 includes transistors 730, 732 as well as an inverter 740.

The voltage multiplexer circuit 712 receives a voltage control signal (VDD_BOOST_EN) and provides a virtual vdd signal to the bit array 710. In certain embodiments, the voltage control signal corresponds to one of the voltage control signals (VOLT CNTL[0:N]) provided by the controller 212. When operating in a more soft error resistant mode of operation, the voltage multiplexer circuit 712 provides a higher vdd voltage level (e.g., 1.0 V) across the bitcells. Alternately, when operating in a less soft error resistant mode of operation, voltage multiplexer circuit 712 provides a lower vdd voltage level (e.g., 0.8 V) across the bitcells. The less soft error resistant mode of operation decreases soft error resistance because the amount of charge on the bitcell storage node is decreased. Accordingly, when it is desirable to increase soft error resistance, the voltage multiplexer circuit 712 increases the voltage across the bitcell so that the higher vdd voltage appears across the bitcell.

When receiving an active voltage control signal (VDD_BOOST_EN), transistor 730 is turned on and transistor 732 is turned off, thus causing the higher voltage to be applied to the bit array 710. When receiving an inactive voltage control signal, transistor 730 is turned off and transistor 732 is turned on, thus causing the lower voltage to be applied to the bit array 710.

Figure 8:
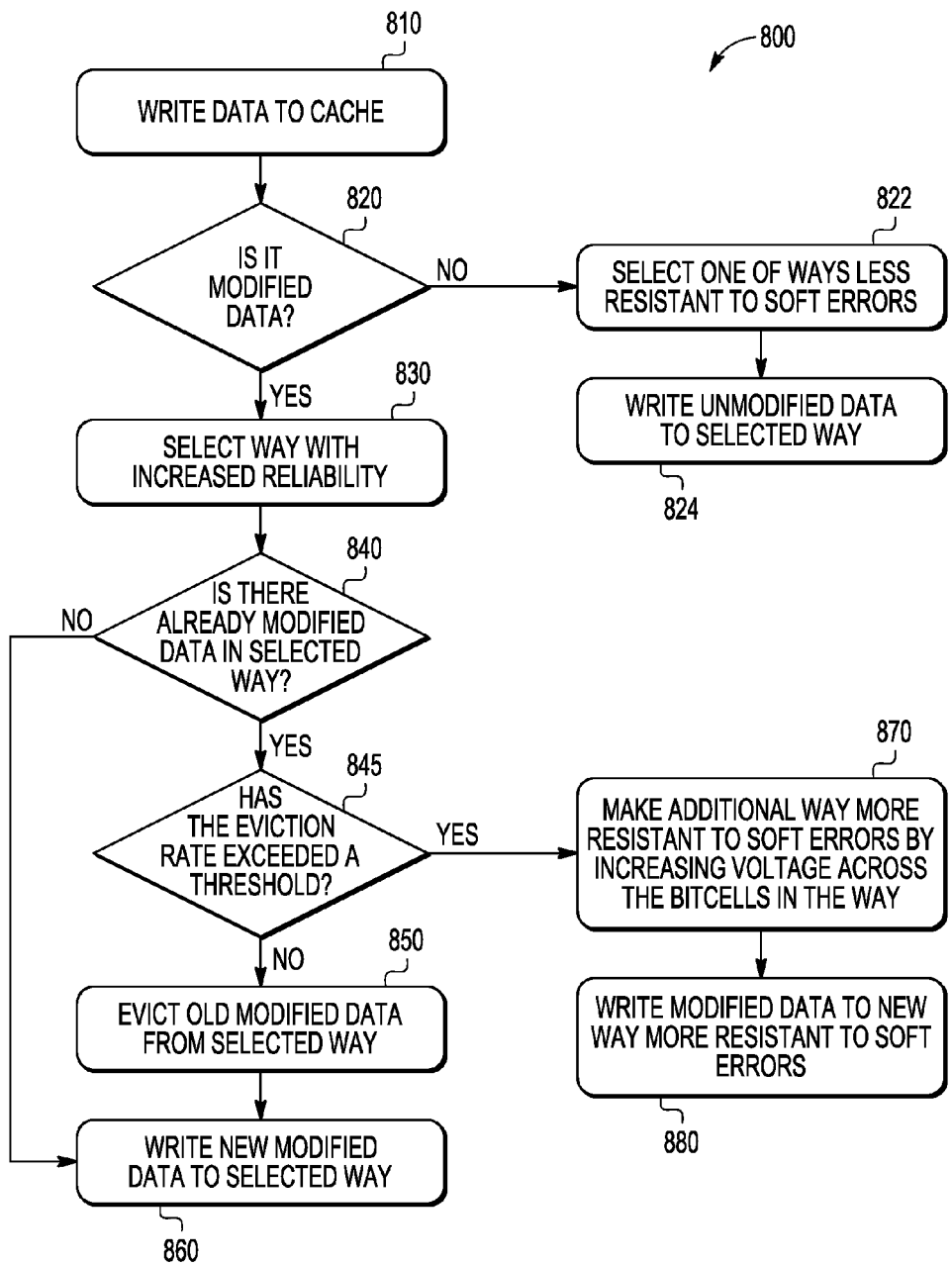
FIG. 8 shows a flow chart of the operation of a system for minimizing soft error rates within caches.

Referring to FIG. 8, a flow chart of the operation of a system 800 for minimizing soft error rates within caches is shown. The operation starts with the initiation of a data write operation to the cache at step 810. Next, the cache controller 212 determines whether the data to be written is modified at step 820. If not, then the cache controller 212 selects one of the ways that are less resistant to soft errors at step 822 and writes the unmodified data to the selected way at step 824.

If the data is modified as determined by step 820 then the cache controller 212 selects the way with the increased reliability at step 830. Next, the cache controller 212 determines whether the selected way already contains modified data in the memory location to be written at step 840. If yes, then at step 845 the cache controller 212 determines whether the eviction rate of the particular way has exceeded an eviction rate threshold.

If no, then at step 850 the cache controller 212 evicts old modified data from the selected way and writes the new modified data to the selected way at step 860. If the cache controller determined at step 840 that the selected way does not contain modified data in the memory location to be written, then the cache controller 212 proceeds to write the modified data in the selected way at step 860.

If the cache controller 212 determines that the eviction rate of the particular way has exceeded an eviction rate threshold at step 845, then the soft error resistance of an additional way is increased by, e.g., increasing the voltage across the bitcells of the additional way at step 870. The cache controller 212 writes the modified data to the additional way at step 880.

Various illustrative embodiments have been described in detail with reference to the accompanying figures. While various details are set forth in the description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, to avoid limiting or obscuring the present invention. Also for example, while the data processing system is shown with a processor having a particular architecture with a single core, other processor architectures are contemplated, including multicore type processor architectures.

For example, in certain embodiments, more than one way may be configured to be more resistant to soft errors. In certain embodiments, the number of ways that are configured to be more resistant to soft errors may be adjusted based upon usage and replacement considerations of the cache.

Figure 9:
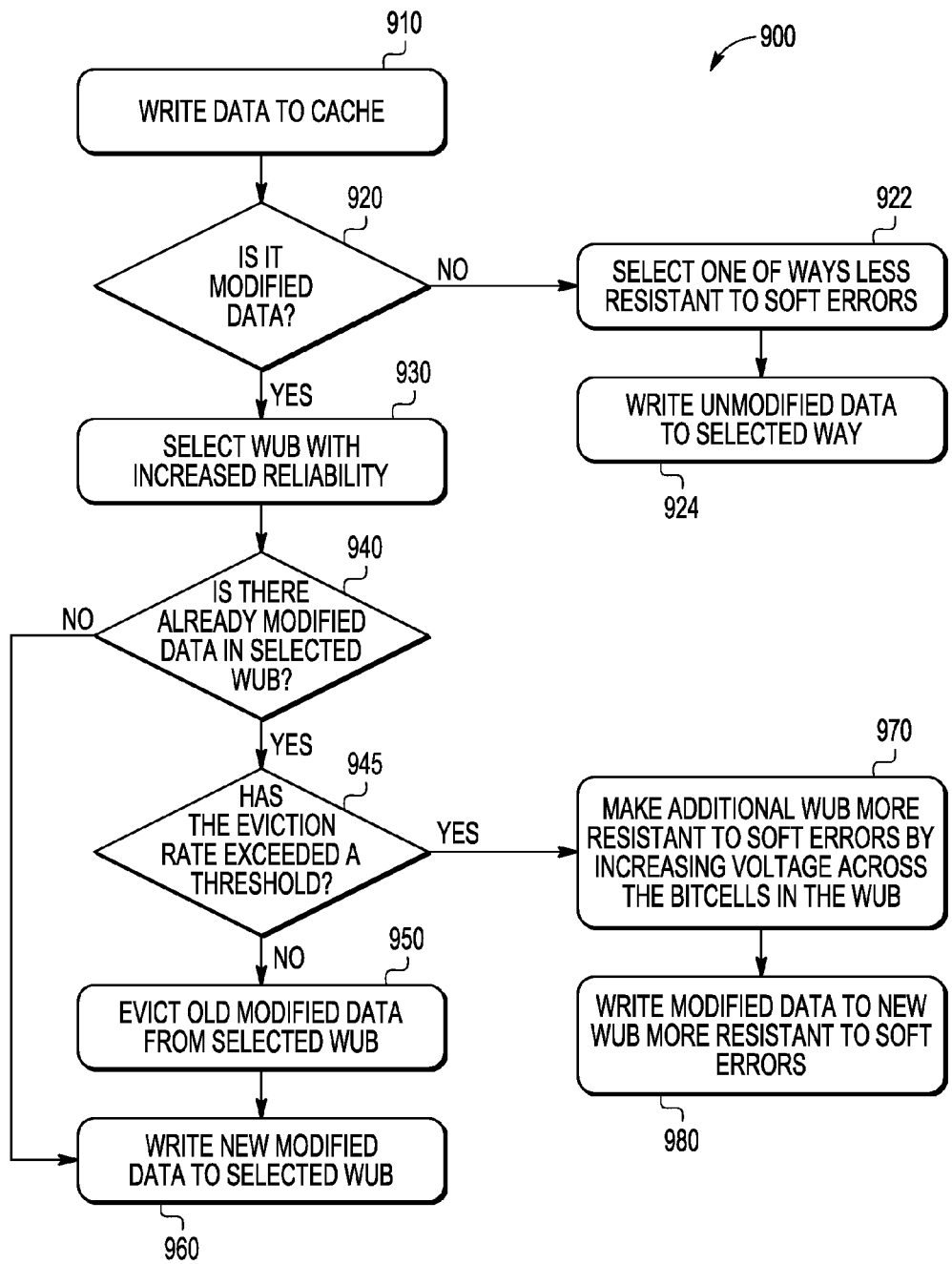
FIG. 9 shows a flow chart of the operation of a system for minimizing soft error rates within caches.

Also for example, in certain embodiments the granularity of the soft error resistance is controlled at a way unit block level. For example, referring to FIG. 9, a flow chart of the operation of a system 900 for minimizing soft error rates within caches is shown. The operation starts with the initiation of a data write operation to the cache at step 910. Next, the cache controller 212 determines whether the data to be written is modified at step 920. If not, then the cache controller 212 selects one of the ways that are less resistant to soft errors at step 922 and writes the unmodified data to the selected way at step 924.

If the data is modified as determined by step 920 then the cache controller 212 selects the way unit block with the increased reliability at step 930. Next, the cache controller 212 determines whether the selected way unit block already contains modified data in the memory location to be written at step 940. If yes, then at step 945 the cache controller 212 determines whether the eviction rate of the particular way has exceeded an eviction rate threshold.

If no, then at step 950 the cache controller 212 evicts old modified data from the selected way unit block and writes the new modified data to the selected way unit block at step 960. If the cache controller determined at step 940 that the selected way unit block does not contain modified data in the memory location to be written, then the cache controller 212 proceeds to write the modified data in the selected way unit block at step 960.

If the cache controller 212 determines that the eviction rate of the particular way unit block has exceeded an eviction rate threshold at step 945, then the soft error resistance of an additional way unit block is increased by, e.g., increasing the voltage across the bitcells of the additional way unit block at step 970. The cache controller 212 writes the modified data to the additional way unit block at step 980.

Additionally, in certain embodiments, if all way unit blocks of a particular way of full then the system may proceed with increasing the soft error resistance to a way unit block located within another way.

Consequently, the invention is intended to be limited only by the spirit and scope of the appended claims, giving full cognizance to equivalents in all respects.

What is claimed is:

1. A memory system comprising:
    a memory array, the memory array comprising a plurality of sections, each of the plurality of sections being individually configurable to operate in a more error resistant mode of operation and a less error resistant mode of operation;
    a memory controller, the memory controller determining whether data to be written to the memory array comprises modified information, the memory controller storing the modified information to a section operating in the more error resistant mode of operation; and,
    wherein the more error resistant mode of operation comprises providing a first voltage across at least one of the plurality of sections of the memory array and the less error resistant mode of operation comprises providing a second voltage across at least another of the plurality of sections of the memory array.

2. The memory system of claim 1 wherein:
    at least one other of the sections is operating in the less error resistant mode of operation; and
    the memory controller stores unmodified information to the at least one other of the sections.

3. The memory system of claim 1 wherein:
    the less error resistant mode of operation corresponds to a drowsy mode of operation;

the more error resistant mode of operation corresponds to a drowsy disabled mode of operation;

the drowsy mode of operation comprises providing a first voltage across at least one of the plurality of sections of the memory array; and the drowsy disabled mode of operation comprises providing a second voltage across at least another of the plurality of sections of the memory array.

4. The memory system of claim 3 further comprising:
a drowsy circuit coupled to the memory array, the drowsy circuit causing the first voltage to be applied across bitcells within the at least one of the plurality of sections of the memory array and the second voltage to be applied across bitcells within the at least another of the plurality of sections of the memory array.

5. The memory system of claim 4 wherein:
each of the at least one of the plurality of sections of the memory array and the at least another of the plurality of sections of the memory array are coupled to respective drowsy circuits.

6. The memory system of claim 1 wherein: the less error resistant mode of operation comprises operating at least one of the plurality of sections of the memory array at a lower voltage; and, the more error resistant mode of operation comprises operating another of the plurality of sections of the memory array at a higher voltage.

7. The memory system of claim 6 further comprising:
a voltage multiplexer circuit coupled to the memory array, the voltage multiplexer circuit causing the first voltage to be applied to the at least one of the plurality of sections of the memory array and the second voltage to be applied to the at least another of the plurality of sections of the memory array.

8. The memory system of claim 1 wherein:
the memory system is a cache of a processor.

9. A method for improving error resilience in a memory array comprising a plurality of sections comprising:
storing modified information to one of the plurality of sections;
individually configuring each of the plurality of sections to operate in a more error resistant mode of operation and a less error resistant mode of operation;
determining whether data to be written to the memory array comprises modified information;
storing the modified information to a section operating in the more error resistant mode of operation;
wherein the more error resistant mode of operation comprises providing a first voltage across at least one of the plurality of sections of the memory array and the less error resistant mode of operation comprises providing a second voltage across at least another of the plurality of sections of the memory array.

10. The method of claim 9 wherein:
at least one other of the sections is operating in the less error resistant mode of operation; and,
the memory controller stores unmodified information to the at least one other of the sections.

11. The method of claim 9 wherein:
the less error resistant mode of operation corresponds to a drowsy mode of operation;
the more error resistant mode of operation corresponds to a drowsy disabled mode of operation;
the drowsy mode of operation comprises providing a first voltage across at least one of the plurality of sections of the memory array; and
the drowsy disabled mode of operation comprises providing a second voltage across at least another of the plurality of sections of the memory array.

12. The method of claim 11 wherein:
a drowsy circuit is coupled to the memory array, the drowsy circuit causing the first voltage to be applied across bitcells within the at least one of the plurality of sections of the memory array and the second voltage to be applied across bitcells within the at least another of the plurality of sections of the memory array.

13. The method of claim 12 wherein:
each of the at least one of the plurality of sections of the memory array and the at least another of the plurality of sections of the memory array are coupled to respective drowsy circuits.

14. The method of claim 9 wherein:
the less error resistant mode of operation comprises operating at least one of the plurality of sections of the memory array at a lower voltage; and,
the more error resistant mode of operation comprises operating another of the plurality of sections of the memory array at a higher voltage.

15. The method of claim 14 further comprising:
causing the first voltage to be applied to the at least one of the plurality of sections of the memory array and the second voltage to be applied to the at least another of the plurality of sections of the memory array.

16. The method of claim 9 wherein:
the memory array is a cache of a processor.

17. A memory comprising:
a first plurality of bitcells and a second plurality of bitcells, each of the first plurality of bitcells and the second plurality of bitcells being individually configurable to operate in a more error resistant mode of operation and a less error resistant mode of operation;
storing modified data only in the more error resistant plurality of bitcells;
wherein the voltage across the first plurality of bitcells is greater than the voltage across the second plurality of bitcells.

* * * * *